(12) United States Patent
Xia et al.

(10) Patent No.: US 8,051,037 B2
(45) Date of Patent: Nov. 1, 2011

(54) SYSTEM AND METHOD FOR PSEUDORANDOM PERMUTATION FOR INTERLEAVING IN WIRELESS COMMUNICATIONS

(75) Inventors: Pengfei Xia, Mountain View, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 436 days.

(21) Appl. No.: 12/264,111

(22) Filed: Nov. 3, 2008

(65) Prior Publication Data

US 2009/0193300 A1    Jul. 30, 2009

Related U.S. Application Data

(60) Provisional application No. 61/023,814, filed on Jan. 25, 2008.

(51) Int. Cl.
*G06F 7/00* (2006.01)
(52) U.S. Cl. ....................................... 707/617
(58) Field of Classification Search .................. 707/617
See application file for complete search history.

(56) References Cited

U.S. PATENT DOCUMENTS

| | | | |
|---|---|---|---|
| 5,955,991 | A | 9/1999 | Kawakubo |
| 6,590,532 | B1 | 7/2003 | Ogawa et al. |
| 6,721,908 | B1 | 4/2004 | Kim et al. |
| 6,731,689 | B2 | 5/2004 | Dogan |
| 6,795,392 | B1 | 9/2004 | Li et al. |
| 6,847,832 | B2 | 1/2005 | Wong et al. |

(Continued)

FOREIGN PATENT DOCUMENTS

EP    1267501 A    12/2002

(Continued)

OTHER PUBLICATIONS

Butler et al., "Beam-Forming Matrix Simplifies Design of Electronically Scanned Antennas." Electronic Design, Apr. 12, 1961, pp. 170-173.

(Continued)

*Primary Examiner* — Pierre Vital
*Assistant Examiner* — Truong Vo
(74) *Attorney, Agent, or Firm* — Kenneth L. Sherman, Esq.; Michael Zarrabian, Esq.; Myers Andras Sherman & Zarrabian LLP

(57) ABSTRACT

A system and method for pseudorandom permutation for interleaving in wireless communication is disclosed. In one embodiment, the method comprises receiving a first ordered sequence of communication symbols having a first order, permuting the first ordered sequence of communication symbols to generate a second ordered sequence of communication symbols having a second order, and outputting the second ordered sequence of communication symbols, wherein the second order is based, at least in part, on a third order having a greater size than the second order, the third order being a pseudorandom permutation defined by the input-output relationship $$Y = \mathrm{mod}\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer.

17 Claims, 6 Drawing Sheets

U.S. PATENT DOCUMENTS

| | | |
|---|---|---|
| 6,937,189 B2 | 8/2005 | Kim |
| 7,013,165 B2 | 3/2006 | Yoon et al. |
| 7,039,370 B2 | 5/2006 | Laroia et al. |
| 7,161,534 B2 | 1/2007 | Tsai et al. |
| 7,239,893 B2 | 7/2007 | Yang |
| 7,312,750 B2 | 12/2007 | Mao et al. |
| 7,342,535 B2 | 3/2008 | Ann et al. |
| 7,450,659 B2 | 11/2008 | Corredoura et al. |
| 2002/0147032 A1 | 2/2002 | Yoon et al. |
| 2002/0122498 A1 | 9/2002 | Dogan |
| 2003/0201936 A1 | 10/2003 | Kim |
| 2004/0218581 A1 | 11/2004 | Cattaneo |
| 2005/0068231 A1 | 3/2005 | Regnier et al. |
| 2005/0206564 A1 | 9/2005 | Mao et al. |
| 2005/0276347 A1 | 12/2005 | Mujtaba et al. |
| 2006/0012520 A1 | 1/2006 | Tsai et al. |
| 2006/0104382 A1 | 5/2006 | Yang et al. |
| 2006/0234645 A1 | 10/2006 | Lin et al. |
| 2006/0248429 A1 | 11/2006 | Grandhi et al. |
| 2007/0189412 A1 | 8/2007 | Xia et al. |
| 2007/0205943 A1 | 9/2007 | Nassiri-Toussi et al. |
| 2007/0266274 A1* | 11/2007 | Lin .............................. 714/699 |
| 2008/0101493 A1 | 5/2008 | Niu et al. |
| 2008/0108390 A1 | 5/2008 | Yoon et al. |
| 2008/0134254 A1 | 6/2008 | Xia et al. |
| 2008/0144751 A1 | 6/2008 | Xia et al. |
| 2008/0204319 A1 | 8/2008 | Niu et al. |
| 2009/0033555 A1 | 2/2009 | Niu et al. |
| 2009/0046010 A1 | 2/2009 | Niu et al. |
| 2009/0046012 A1 | 2/2009 | Niu et al. |
| 2009/0047910 A1 | 2/2009 | Niu et al. |
| 2009/0058724 A1 | 3/2009 | Xia et al. |
| 2009/0121935 A1 | 5/2009 | Xia et al. |
| 2009/0189812 A1 | 7/2009 | Xia et al. |
| 2009/0238156 A1 | 9/2009 | Yong et al. |
| 2010/0009635 A1 | 1/2010 | Qin et al. |

FOREIGN PATENT DOCUMENTS

| | | |
|---|---|---|
| JP | 2004/140642 A2 | 5/2004 |
| KR | 2000/0071545 A | 11/2000 |
| KR | 2001/0015765 | 2/2001 |
| KR | 2001/0018995 A | 3/2001 |
| KR | 2002/0022109 A | 3/2002 |
| KR | 2006/0068921 A | 6/2006 |
| WO | WO 01/17131 | 3/2001 |
| WO | WO 03/090386 | 10/2003 |

OTHER PUBLICATIONS

Buzzi S. et al., Performance of iterative data detection and channel estimation for single-antenna and multiple-antennae wireless communications, IEEE Transactions on Vehicular Technology, Jul. 2004, 53(4): 1085-1104.

Caetano, Lianne, SiBEAM—60 GHz Architecture for Wireless Video Display, SiBEAM, Inc. White Paper, Mar. 2006, [Available online: http://www.sibeam.com/whtpapers/60_GHz_for_WirelessHD_3_06.pdf], pp. 1-6.

Coffey, S. et al., "Joint Proposal: High throughput extension to the 802.11 Standard: PHY" IEEE 802.11-05/1102r4, draft proposal, Jan. 2006, pp. 1-82.

De Los Santos, "MEMS-Based Microwave Circuits and Systems, Introduction to Microelectromechanical (MEM) Microwave Systems," Artech House, p. 167-168 and 193, 1999.

Furrer et al., Bounds on the ergodic capacity of training-based multiple-antenna systems, Proceedings, Internal Symposium on Information Theory, ISIT, Sep. 2005, p. 780-784.

Hachman, "CE Giants back Amimon's Wireless HDTV Tech," online: www.pcmag.com, 1 page, Jul. 23, 2008.

Hansen, R.C., Phased Array Antennas, John Wiley and Songs, New York, 1998, pp. 1-507.

Hitachi et al., High-Definition Multimedia Interface (HDMI) Specifications version 1.2, Aug. 22, 2005, pp. 1-214.

IEEE 802.11 Working Group of the 802 Committee, "Draft Amendment to Standard for Information Technology—Telecommunications and information exchange between systems—Local and metropolitan are networks—Specific requirements—Part 11: Wireless LAN Medium Access Control (MAC) and Physical Layer (PHY) specifications: Enhancements for Higher Throughput," IEEE P802.11n/D1.0, Mar. 2006, pp. 1-335.

IEEE 802.15.3 Working Group. Part 15.3: Wireless medium access control (MAC) and physical layer (PHY) specifications for high rate wireless personal area networks (WPANs). IEEE Draft Standard, Draft P802.15.3/D16, Sep. 2003, pp. 1-324.

LG Electronics Inc., WirelessHD Specification Version 1.0 Overview, Oct. 9, 2007, 77 pages.

Lin et al., Error Control Coding—Fundamentals and Applications, 2nd Edition, Pearson Prentice Hall, 2004, Chapter 16, pp. 774-780.

NEC develops compact millimeter-wave transceiver for uncompressed HDTV signal transmission, NE Asia Online, Apr. 5, 2005, (Downloaded from http://neasia.nikkeibp.com/topstory/000913 on Sep. 29, 2006).

Niu et al., "Beamforming for Space-Time Coded IEEE 802.11n System with Known Fading Correlations," in Proceeding of 39th Asilomar Conference on Signals, Systems and Computers, Pacific Grove, CA, Nov. 2005.

Project: IEEE P802.15 Working Group for Wireless Personnel Area Networks (WPANs), Presentations, Nov. 12, 2006 & Jan. 15, 2008, pp. 1-64.

Razavi, B., "Challenges in Portable RF Transceiver Design." Circuits & Devices, 8755-3996/96, IEEE, Sep. 1996, pp. 12-24.

Rye et al., On Quadratic Inverses for Quadratic Permutation Polynomials Over Integer Rings, IEEE Trans. On Information Theory, Mar. 2006, 52(3): 1-12.

Scintera, "Advanced Signal Processing Platform," Scintera Networks, Sep. 2003, pp. 1-9.

Stüber, G. et al., "Broadband MIMO-OFDM Wireless Communications", Proceedings of the IEEE, vol. 92, No. 2, Feb. 2004, pp. 271-294.

Takeshita et al., On Maximum Contention-Free Interleavers and Permutation Polynomials Over Integer Rings, IEEE Trans. On Information Theory, Mar. 2006, 52(3): 1-13.

Van Veen et al., Beamforming: A Versatile Approach to Spatial Filtering, IEEE ASSP Magazine, Apr. 1988, 5(2):4-24.

International Search Report and Written Opinion dated Aug. 28, 2009 for PCT/KR2009/000365, filed Jan. 23, 2009.

International Search Report dated Jun. 29, 2009 for PCT Application No. PCT/KR2009/000373, filed Jan. 23, 2009.

International Search Report dated Sep. 16, 2009 for PCT Application No. PCT/KR2009/00576, filed Feb. 6, 2009.

U.S. Office Action dated Jun. 23, 2008 in U.S. Appl. No. 11/890,207, filed Aug. 2, 2007.

U.S. Office Action dated Nov. 24, 2008 in U.S. Appl. No. 11/890,207, filed Aug. 2, 2007.

U.S. Advisory Action dated Mar. 2, 2009 in U.S. Appl. No. 11/890,207, filed Aug. 2, 2007.

U.S. Office Action dated Apr. 6, 2009 in U.S. Appl. No. 11/890,207, filed Aug. 2, 2007.

U.S. Office Action dated Jan. 2, 2009 in U.S. Appl. No. 11/881,978, filed Jul. 30, 2007.

U.S. Office Action dated Jul. 25, 2008 in U.S. Appl. No. 11/881,978, filed Jul. 30, 2007.

U.S. Notice of Allowance dated Sep. 15, 2009 in U.S. Appl. No. 11/881,978, filed Jul. 30, 2007.

U.S. Office Action dated Sep. 24, 2009 in U.S. Appl. No. 11/899,286, filed Sep. 5, 2007.

U.S. Notice of Allowance dated Jan. 21, 2010 in U.S. Appl. No. 11/899,286, filed Sep. 5, 2007.

U.S. Office Action dated Oct. 15, 2009 in U.S. Appl. No. 11/706,942, filed Feb. 13, 2007.

* cited by examiner

SYSTEM AND METHOD FOR PSEUDORANDOM PERMUTATION FOR INTERLEAVING IN WIRELESS COMMUNICATIONS

CROSS-REFERENCE TO RELATED APPLICATIONS

This application claims the benefit under 35 U.S.C. §119(e) of U.S. Provisional Application No. 61/023,814, filed on Jan. 25, 2008, which is incorporated by reference in its entirety.

BACKGROUND

1. Field

This invention relates to error reduction in communication systems, and in particular to use of pseudorandom permutation to perform interleaving of bits, symbols, or sequences.

2. Description of the Related Technology

A wireless communication network is a telecommunications network where the interconnections among the communication devices are implemented without the use of wires. Wireless telecommunications networks are generally implemented with some type of remote information transmission system that uses electromagnetic waves, such as radio waves, for the carrier and this implementation usually takes place at the physical layer of the network.

A wireless personal area network (WPAN) is one type of wireless network used for communication among a plurality of devices, such as computers, mobile phones, personal digital assistants, printers, digital cameras, televisions, media players, etc. Usually, a WPAN covers a short range up to 10 or 20 meters. A number of standards for such network communications have recently been developed, including, but not limited to, Bluetooth and IEEE 802.15.

An important component of a WPAN transmitter or receiver is an interleaver used to interleave bits, data symbols, coded sequences, or other communications symbols. Such interleaving is often used to provide error resilience in digital communication systems. The concept behind interleaving is to shuffle the input sequence in an almost-random manner such that originally adjacent bits/symbols are far apart after interleaving. Truly random interleaving is, in some cases, not favorable, because it may not be easily generated, and/or it may not be easily reconstructed. Deterministic interleaving, which can generate seemingly random permutations, is generally implemented in practice.

SUMMARY OF CERTAIN INVENTIVE ASPECTS

One aspect of the development is a method of interleaving a sequence of communication symbols, the method comprising receiving a first ordered sequence of communication symbols having a first order, permuting the first ordered sequence of communication symbols to generate a second ordered sequence of communication symbols having a second order, and outputting the second ordered sequence of communication symbols, wherein the second order is based, at least in part, on a third order having a greater size than the second order, the third order being a pseudorandom permutation defined by the input-output relationship $$Y = \mathrm{mod}\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer.

Another aspect of the development is a system an interleaver comprising an input configured to receive a first ordered sequence of communication symbols having a first order, a permuter configured to permute the first ordered sequence of communication symbols to generate a second ordered sequence of communication symbols having a second order, and an output configured to output the second ordered sequence of communication symbols, wherein the second order is based, at least in part, on a third order having a greater size than the second order, the third order being a pseudorandom permutation defined by the input-output relationship $$Y = \mathrm{mod}\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer.

Another aspect of the development is a method of de-interleaving a sequence of communication symbols, the method comprising receiving a second ordered sequence of communication symbols having a second order, permuting the second ordered sequence of communication symbols to generate a first ordered sequence of communication symbols having a first order, and outputting the first ordered sequence of communication symbols, wherein the second order is based, at least in part, on a third order having a greater or equal size than the second order, the third order being a pseudorandom permutation defined by the input-output relationship $$Y = \mathrm{mod}\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer.

Another aspect of the development is a de-interleaver comprising an input configured to receive a second ordered sequence of communication symbols having a second order, a permuter configured to permute the second ordered sequence of communication symbols to generate a first ordered sequence of communication symbols having a first order, and an output configured to output the first ordered sequence of communication symbols, wherein the second order is based, at least in part, on a third order having a greater or equal size than the second order, the third order being a pseudorandom permutation defined by the input-output relationship $$Y = \mod\left(\frac{m * S * (S + 1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer.

DETAILED DESCRIPTION OF THE CERTAIN INVENTIVE EMBODIMENTS

Certain embodiments provide a method and system for interleaving a sequence of communication symbols in a wireless network. The following detailed description is directed to certain sample embodiments of the invention. However, the invention can be embodied in a multitude of different ways as defined and covered by the claims. In this description, reference is made to the drawings wherein like parts are designated with like numerals throughout.

WPAN System Overview

A wireless personal area network (WPAN) system is a computer network used in communication between devices (for example, telephones and personal digital assistants) that are each close to the same person. The devices may or may not belong to the person in question. The reach of a WPAN is typically a few meters, but may be more under certain circumstances. A WPAN may be used to communicate between the devices, or to interconnect with a higher level network such as the internet. A number of standards for network communications have recently been developed, including, but not limited to, Bluetooth and IEEE 802.15.

Figure 1:
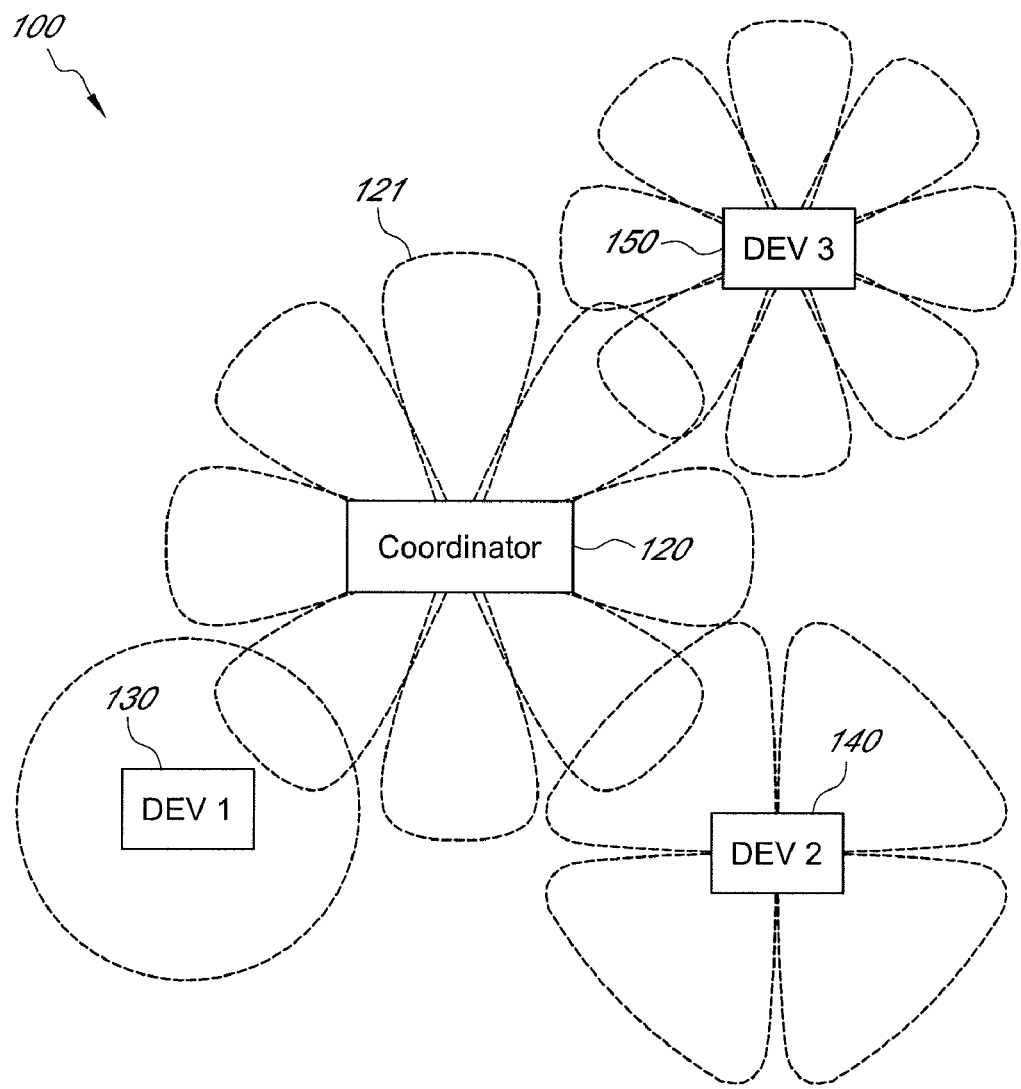
FIG. 1 is a diagram of a wireless network illustrating signal waveforms of wireless devices having a variety of directional and omni-directional antennae.

FIG. 1 is a diagram of an exemplary wireless personal area network according to one embodiment. The illustrated network 100 includes a coordinator 120 and first to third devices 130, 140, 150. The coordinator 120 and the first to third devices 130, 140, 150 may communicate using a variety of different parameters, including different modulation and coding schemes, different protocols, different random access schemes, and different frequency bands.

The coordinator 120 may be responsible for coordinating data transfer between itself and other devices. The coordinator 120 may partition a wireless channel into a number of time periods and schedule communication between specific devices during those time periods. The coordinator may be, for example, a television, a set-top box, a personal computer, a laptop computer, or a dedicated controlling box.

In the network 100 of FIG. 1, the coordinator 120 is configured to perform directional transmission and/or reception with the first to third devices 130, 140, 150. The coordinator 120 may utilize sector antennas or antenna arrays for the directional transmission and/or reception. When a sector antenna, such as a horn antenna, is used, each sector 121 represents a different direction for transmission or reception of data. The coordinator 120 selects a sector and, while the sector is selected, is able to transmit or receive data in that direction. When an antenna array, such as a linear array or circular array, is used, direction is determined by selection of the antenna coefficients.

The first device 130 may utilize omni-directional transmission and reception. The second device 140 may utilize a sectored antenna with more or less sectors than the coordinator 120. In addition, the third device 150 may utilize a sector antenna with the same number of sectors as the coordinator 120. Each of the first to third devices 130, 140, 150 can be a television, a desktop computer, a laptop computer, a set-top box, a DVD player or recorder, a VCR, an audio player, a digital camera, a camcorder, a game device, or a computer peripheral such as a mouse, a keyboard, a printer, or a scanner.

In directional transmission, beamforming may also be used by either the coordinator 120 or one or more of the devices. In some embodiments, an asymmetric antenna system (AAS) may be employed by either the coordinator or one or more of the devices, resulting in different sets of transmission and reception directions.

Figure 2:
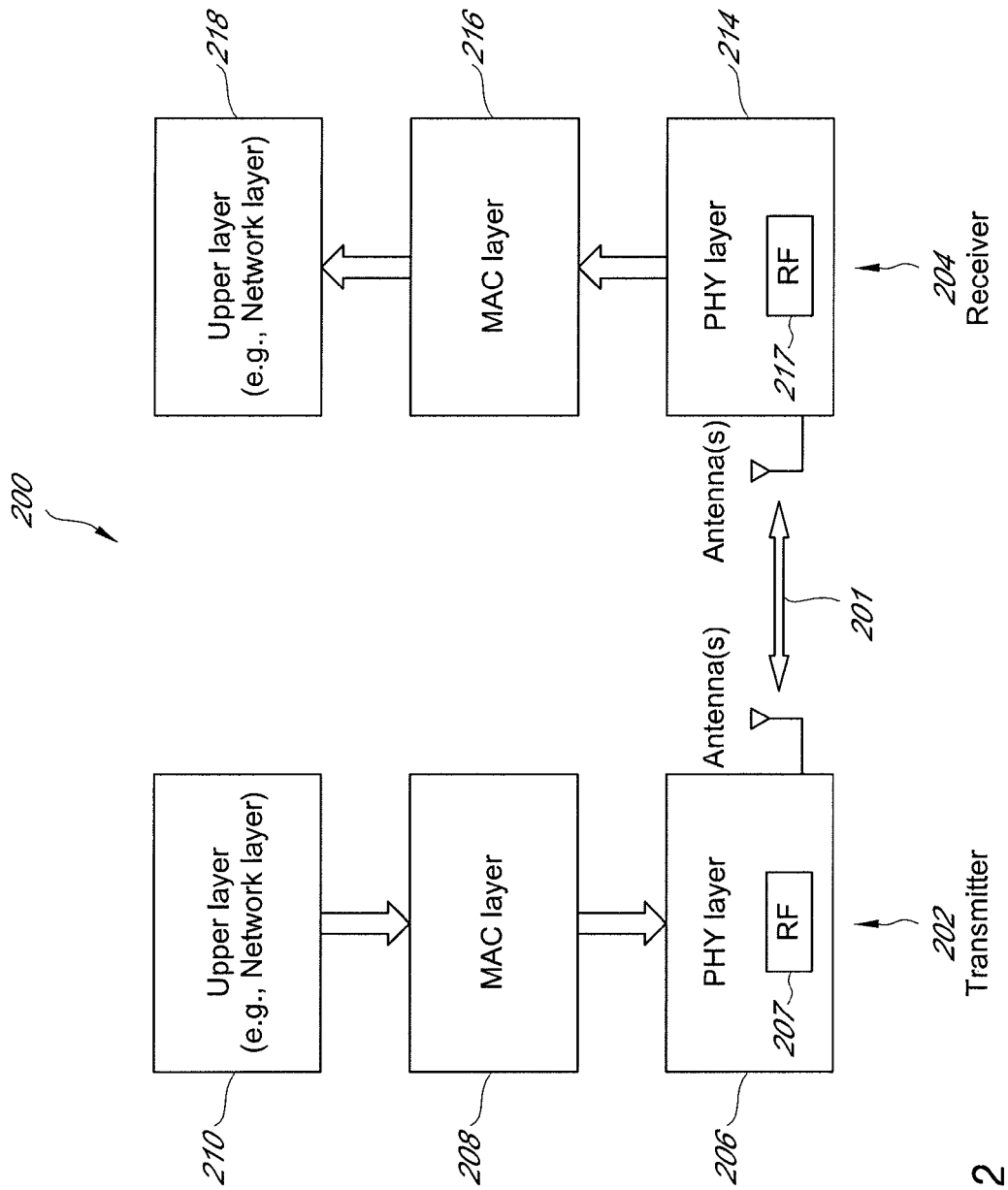
FIG. 2 is a functional block diagram of one embodiment of a communication system for transmission of data over a wireless medium.

FIG. 2 shows a generalized block diagram illustrating an example wireless personal area network (WPAN) system 200. The example WPAN system 200 includes a wireless transmitter 202 and wireless receiver 204. The transmitter 202 includes a physical (PHY) layer 206, a media access control (MAC) layer 208, an upper layer 210, and one or more antennas. Similarly, the receiver 204 includes a PHY layer 214, a MAC layer 216, an upper layer 218, and one or more antennas. In some embodiments, the PHY layers 206, 214 include radio frequency (RF) modules 207, 217. The PHY layers 206, 214 provide wireless communication between the transmitter 202 and the receiver 204 via the RF modules 207, 217 and the one or more antennas through a wireless medium 201.

The upper layers 210, 218 represent one or more layers that are above the MAC layers 208, 216, respectively, and send command and/or data messages to the MAC layers. In certain embodiments (e.g., OSI or TCP/IP models), the upper layer 210, 218 includes a network layer. In certain embodiments, the network layer includes an IP protocol that performs the basic task of getting data packets from source to destination. In other embodiments (e.g., five-layer TCP/IP model), the upper layer 210, 218 further includes a transport layer and an application layer. In other embodiments, (e.g., seven-layer OSI model), the upper layer 210, 218, in addition to the transport layer and the application layer, further includes a session layer and a presentation layer.

In the wireless transmitter 202, the upper layer 210 provides data (e.g., text, graphics, or audio data) and/or command messages to the MAC layer 208. In certain embodiments, the MAC layer 208 can include a packetization module (not shown) which puts the data and/or command messages into the form of one or more data packets. The MAC layer 208 then passes the data packets to the PHY layer 206. The PHY/MAC layers of the transmitter 202 add PHY and MAC headers to the data packets. The PHY layer 206 transmits wireless signals including the data packets to the receiver 204 via the RF module 207 over the wireless channel 201.

In the wireless receiver 204, the PHY layer 214 receives the transmitted wireless signals including the data packets via the RF module 217. The PHY/MAC layers 214, 216 then process the received data packets to extract one or more data/command messages. The extracted data/command messages are passed to the upper layer 210 where the messages are further processed and/or transferred to other modules or devices to be displayed (text or graphics) or played (audio), for example.

Interleaving Overview

A sequence of communication symbols is a well-ordered set of communication symbols such as bits, symbols, or sub-sequences. A well-order is a binary relation (herein denoted by <) on some set, generally defining a place within an order for each element of the set. Examples of well-orders include the letters of the alphabet according to a dictionary order (A<B<C...), the natural numbers (1<2<3...), and the rank of playing cards (... J<Q<K<A). A well-order may be described as having a size equal to the number of elements which it uniquely orders.

The order of a sequence of communication symbols can be notated using a sequence of whole or natural numbers, each number corresponding to an ordinal position within the sequence. For example, given a set of five elements, some of which may be identical, a reordering of [3 2 5 1 4] would indicate that the element which was third in the first order is first in the second order, the element which was second in the first order is second in the second order, the element which was fifth in the first order is third in the second order, the element which was first in the first order is fourth in the second order, and the element which was fourth in the first order is fifth in the second order. Although numbers, including integers, may be used to denote the order or permutation, it is understood that the order is not limited to a sequence of numbers, but rather to an order which can be so represented.

Such reordering, or interleaving, is often used in communications to prevent errors that occur due to noise or interference. Communications data is often transmitted with error control bits that enable the receiver to correct a certain number of errors that occur during transmission. If a burst error occurs, that is many errors in a short amount of time, it may be that the errors are not correctable. On the other hand, if the same number of errors occur, but they are spread out over a longer time period, those errors are more likely to be correctable. It is thus desirable, in some applications, to avoid bursty error patterns. To reduce the effect of such burst errors, the bits of a number of codewords are rearranged, or interleaved, before being transmitted. This way, a bursty error pattern is changed to a number of errors spread out over a longer time period, and the decoder can decode the codewords correctly after the codewords have been deinterleaved, or rearranged back into their original order.

Typical interleavers are designed such that the interleaved output has certain properties, such as ensuring that elements which are adjacent in the input ordering have at least a certain number of elements between them in the output ordering. However, generally well-designed interleavers are designed for a specific number of input symbols, which is usually a power of two, e.g., 2, 4, 8, 16, etc. Described herein are methods of using such interleavers to create interleavers capable of interleaving an arbitrary number of symbols.

Figure 3:
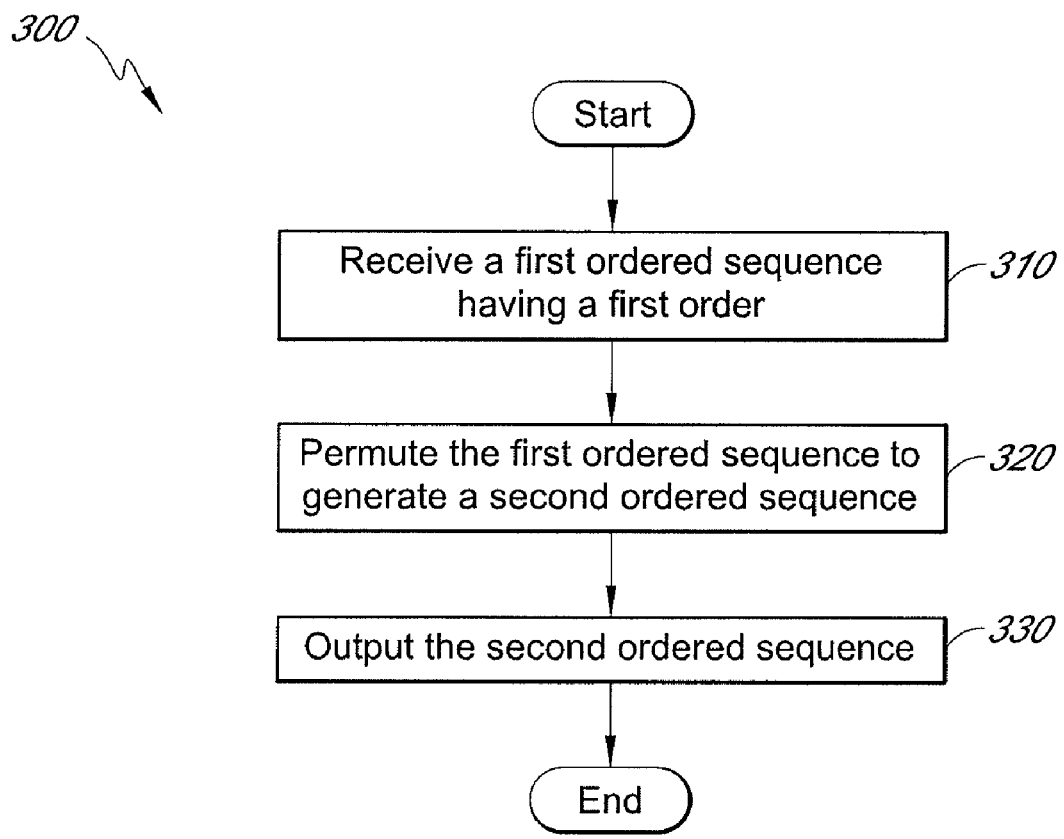
FIG. 3 is a flowchart illustrating a method of interleaving a sequence of communication symbols.

FIG. 3 is a flowchart illustrating a method of interleaving a sequence of communication symbols. The procedure 300 of FIG. 3 begins, at block 310, where a first ordered sequence of communication symbols having a first order is received. The sequence, may, for example, be a sequence of bits output from a forward error correction code encoder. The sequence may be a sequence of QPSK symbols. The sequence may also be a sequence of sub-sequences or data blocks. In block 320, the first ordered sequence is permuted to generate a second ordered sequence having a second order. Thus, the second ordered sequence is composed of the same elements as the first ordered sequence, but with a different order. In one embodiment of the invention, the second order is based on an abridgment of a third order having a greater size than the second order, e.g., able to order more communication symbols. After permuting the first ordered sequence in block 320, the interleaver outputs, in block 330, the second ordered sequence of communication symbols.

An example of abridging a third order to generate a second order is now discussed. As mentioned above, interleavers with good properties exist for sizes which are powers of two. These interleavers can be used to generate other interleavers of arbitrary size which maintain many of the good properties of the original interleaver. A sequence of twelve bits, denoted A, may be written as [1 0 0 1 0 0 1 1 0 0 1 0], with the order written as [1 2 3 4 5 6 7 8 9 10 11 12]. This notation indicates that the first bit is a 1, the second bit is a 0, the third bit is also a 0, etc. One may generate a larger order, which is a power of two by simply writing [1 2 3 4 5 6 7 8 9 10 11 12 13 14 15 16]. The output order of a particular pseudorandom interleaver may be [1 16 14 11 7 2 12 5 13 4 10 15 3 6 9 8], indicating that, if a sequence of sixteen elements were input, the output would be reordered such that the first element of the first sequence was the first element of the second sequence, the sixteenth element of the first sequence was the second element of the second sequence, etc. The order can be modified by, for example, removing the elements greater than twelve, to generate an order which can be written as [1 11 7 2 12 5 4 10 3 6 9 8], indicating that the first element of the first sequence should be the first element of the second sequence, the eleventh element of the first sequence should be the second element of the second sequence, etc. Thus, the output of the interleaver is [1 1 1 0 0 0 1 0 0 0 1].

Figure 4:
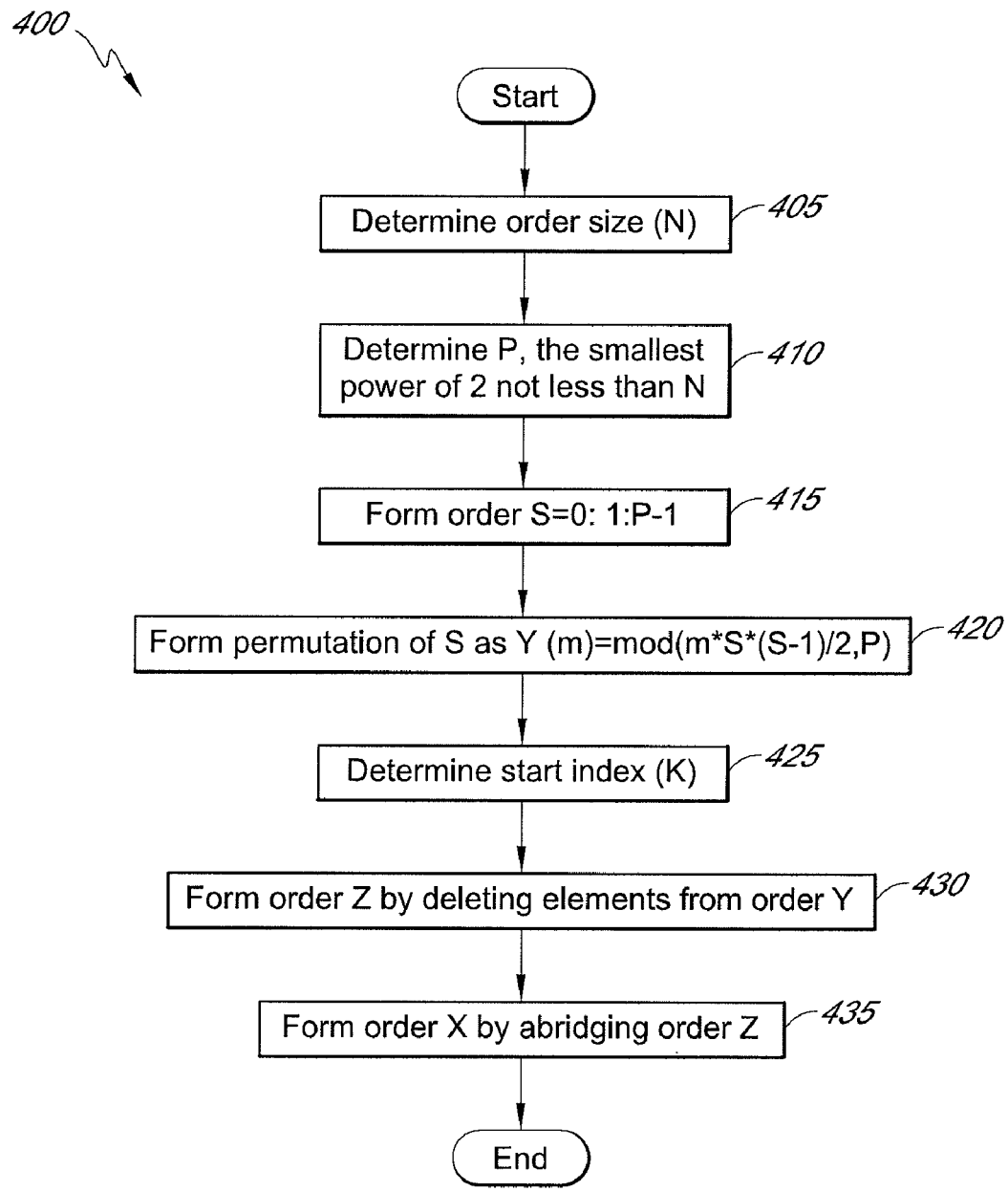
FIG. 4 is a flowchart illustrating a method of permuting a sequence.

Another example of permuting a sequence using an abridged order is shown with respect to FIG. 4. FIG. 4 is a flowchart illustrating a method of permuting a sequence. The procedure 400 of FIG. 4 begins, at block 405, where the size (N) of the output order is determined. The size may, for example, be the number of elements in a sequence to be permuted or the size of the input order. Based on the size of the output order, in block 410, the smallest power of two (P) not less than N is determined. In other embodiments of the invention, P is the smallest power of two which is strictly greater than N. In block 415, an order (S) is formed, represented by the sequence of integers from 0 to P−1 in increasing order. In block 420, another order (Y) is formed, based on a permutation of S. In one embodiment of the invention, the order Y is formed as mod(m*S*(S−1)/2,P), where mod indicates the modulus and m is an integer. In block 425, a start index (K) is determined. The start index may be 0, N, or any integer between them. Yet another order (Z) is formed, in block 425, by abridging order Y. In one embodiment, the entries corresponding to the [K, K+1, ..., K+P−N−1]$^{th}$ position are removed to form order Z. The output order (X) is finally formed, in block 430, by compressing order Z. Order Z, when written as a sequence of cardinal numbers, would contain N−K entries larger than K+P−N−1. From each of those entries, P−N is subtracted, yielding an order (X) which can be written as the set of integers from 0 to N−1 in a non-sequential order.

The above is illustrated by the following two examples:

EXAMPLE 1

| N = 60; P = 64; m = P − 1 = 63; K = 60; | | | | | | | | | | | | | | | |
|---|---|---|---|---|---|---|---|---|---|---|---|---|---|---|---|
| S = 0:1:63 | | | | | | | | | | | | | | | |
| 0 | 1 | 2 | 3 | 4 | 5 | 6 | 7 | 8 | 9 | 10 | 11 | 12 | 13 | 14 | 15 |
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| Y(m = P − 1) | | | | | | | | | | | | | | | |
| 0 | 63 | 61 | 58 | 54 | 49 | 43 | 36 | 28 | 19 | 9 | 62 | 50 | 37 | 23 | 8 |
| 56 | 39 | 21 | 2 | 46 | 25 | 3 | 44 | 20 | 59 | 33 | 6 | 42 | 13 | 47 | 16 |
| 48 | 15 | 45 | 10 | 38 | 1 | 27 | 52 | 12 | 35 | 57 | 14 | 34 | 53 | 7 | 24 |
| 40 | 55 | 5 | 18 | 30 | 41 | 51 | 60 | 4 | 11 | 17 | 22 | 26 | 29 | 31 | 32 |
| Z = X | | | | | | | | | | | | | | | |
| 0 | 58 | 54 | 49 | 43 | 36 | 28 | 19 | 9 | 50 | 37 | 23 | 8 | 56 | 39 | |
| 21 | 2 | 46 | 25 | 3 | 44 | 20 | 59 | 33 | 6 | 42 | 13 | 47 | 16 | 48 | |
| 15 | 45 | 10 | 38 | 1 | 27 | 52 | 12 | 35 | 57 | 14 | 34 | 53 | 7 | 24 | |
| 40 | 55 | 5 | 18 | 30 | 41 | 51 | 4 | 11 | 17 | 22 | 26 | 29 | 31 | 32 | |

In this example, but not necessarily in all cases, Z and X are equal.

EXAMPLE 2

| N = 60; P = 64; m = 1; K = 0; | | | | | | | | | | | | | | | |
|---|---|---|---|---|---|---|---|---|---|---|---|---|---|---|---|
| S = 0:1:63 | | | | | | | | | | | | | | | |
| 0 | 1 | 2 | 3 | 4 | 5 | 6 | 7 | 8 | 9 | 10 | 11 | 12 | 13 | 14 | 15 |
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| Y(m = 1) | | | | | | | | | | | | | | | |
| 0 | 31 | 29 | 58 | 54 | 17 | 11 | 36 | 28 | 51 | 41 | 62 | 50 | 5 | 55 | 8 |
| 56 | 7 | 53 | 2 | 46 | 57 | 35 | 44 | 20 | 27 | 1 | 6 | 42 | 45 | 15 | 16 |
| 48 | 47 | 13 | 10 | 38 | 33 | 59 | 52 | 12 | 3 | 25 | 14 | 34 | 21 | 39 | 24 |
| 40 | 23 | 37 | 18 | 30 | 9 | 19 | 60 | 4 | 43 | 49 | 22 | 26 | 61 | 63 | 32 |
| Z | | | | | | | | | | | | | | | |
| 31 | 29 | 58 | 54 | 17 | 11 | 36 | 28 | 51 | 41 | 62 | 50 | 5 | 55 | 8 | |
| 56 | 7 | 53 | 46 | 57 | 35 | 44 | 20 | 27 | 6 | 42 | 45 | 15 | 16 | 48 | |
| 47 | 13 | 10 | 38 | 33 | 59 | 52 | 12 | 25 | 14 | 34 | 21 | 39 | 24 | 40 | |
| 23 | 37 | 18 | 30 | 9 | 19 | 60 | 4 | 43 | 49 | 22 | 26 | 61 | 63 | 32 | |
| X | | | | | | | | | | | | | | | |
| 27 | 25 | 54 | 50 | 13 | 7 | 32 | 24 | 47 | 37 | 58 | 46 | 1 | 51 | 4 | |
| 52 | 3 | 49 | 42 | 53 | 31 | 40 | 16 | 23 | 2 | 38 | 41 | 11 | 12 | 44 | |
| 43 | 9 | 6 | 34 | 29 | 55 | 48 | 8 | 21 | 10 | 30 | 17 | 35 | 20 | 36 | |
| 19 | 33 | 14 | 26 | 5 | 15 | 56 | 0 | 39 | 45 | 18 | 22 | 57 | 59 | 28 | |

In this example, Z and X are unequal. In fact, Z is not an appropriate reordering of the sequence consisting of the integers between 0 and N−1, because it is missing 0, 1, 2, and 3.

Applications

Interleavers find different uses in a variety of communication systems. In one embodiment, the bits or symbols being interleaved are representative of audio or video data, such as may be transmitted by a television, a desktop computer, a laptop computer, a set-top box, a DVD player or recorder, a VCR, an audio player, a digital camera, a camcorder, or a game device. For example, in one particular embodiment, the communication symbols are representative of uncompressed high definition video data, such as that found in WiHD systems. In another embodiment, the bits or symbols being interleaved are representative of data issued by a computer peripheral such as a mouse, a keyboard, a printer, or a scanner.

Figure 5:
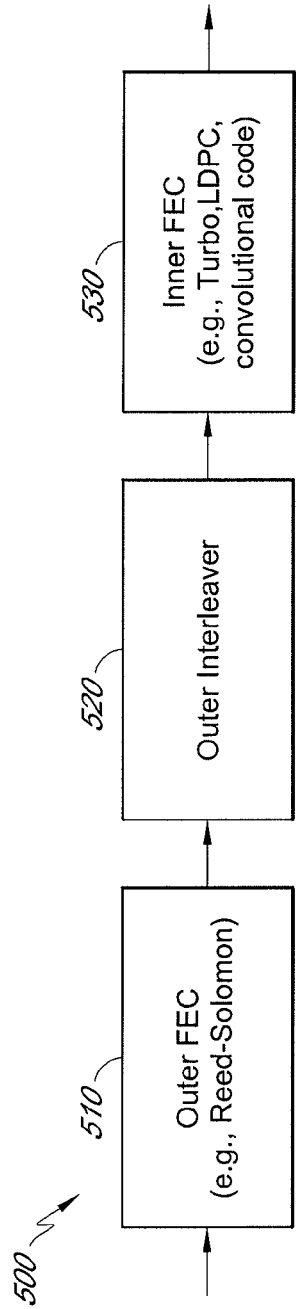
FIG. 5 is a functional block diagram of a system illustrating the use of a pseudorandom permuter as an outer interleaver.

The above pseudorandom permutation can be used as an outer interleaver between two error correcting codes. FIG. 5 is a functional block diagram of a system illustrating the use of the pseudorandom permuter as an outer interleaver. The system 500 comprises an outer forward error correction code encoder 510, an outer interleaver 520, and an inner forward error correction code encoder 530. In some embodiments, the outer code is a Reed-Solomon linear cyclic code and the inner code is a convolutional code, a turbo code, a LDPC code, a trellis-coded modulation scheme, or based on another coding scheme.

The interleaver above may also be used for interleaving data symbols prior to block transmission. Block transmission here refers to either OFDM, single carrier block transmission (SCBT), or variants of a similar nature. The pseudorandom permutation can also be used as a symbol interleaver for either OFDM or SCBT or any of their variants (e.g., OFDMA).

One common practice for OFDM/SCBT block transmission is that certain positions of the block might be pre-occupied after interleaving. These could be null tones for OFDM, or could be pilot tones for OFDM/SCBT. There are at least two ways in getting around those pre-occupied positions after interleaving.

Figure 6:
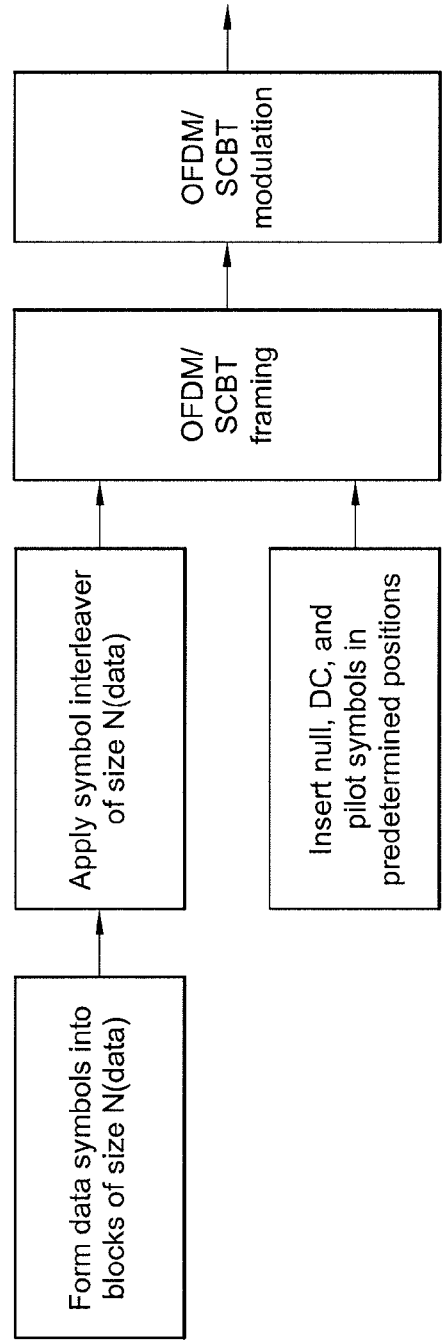
FIG. 6 is a functional block diagram of a system illustrating the use of a pseudorandom permuter to interleave only data symbols.

In one embodiment, the pre-occupied positions are left alone and an interleaver is formed that interleaves only the data symbols. For example, in the following OFDM setup $N_{data}=360$, $N_{null/DC}=130$, $N_{pilot}=22$, and $N_{all}=512$. An interleaver with a size of 360 may be formed that interleaves only the data symbols, as illustrated in FIG. 6.

Figure 7:
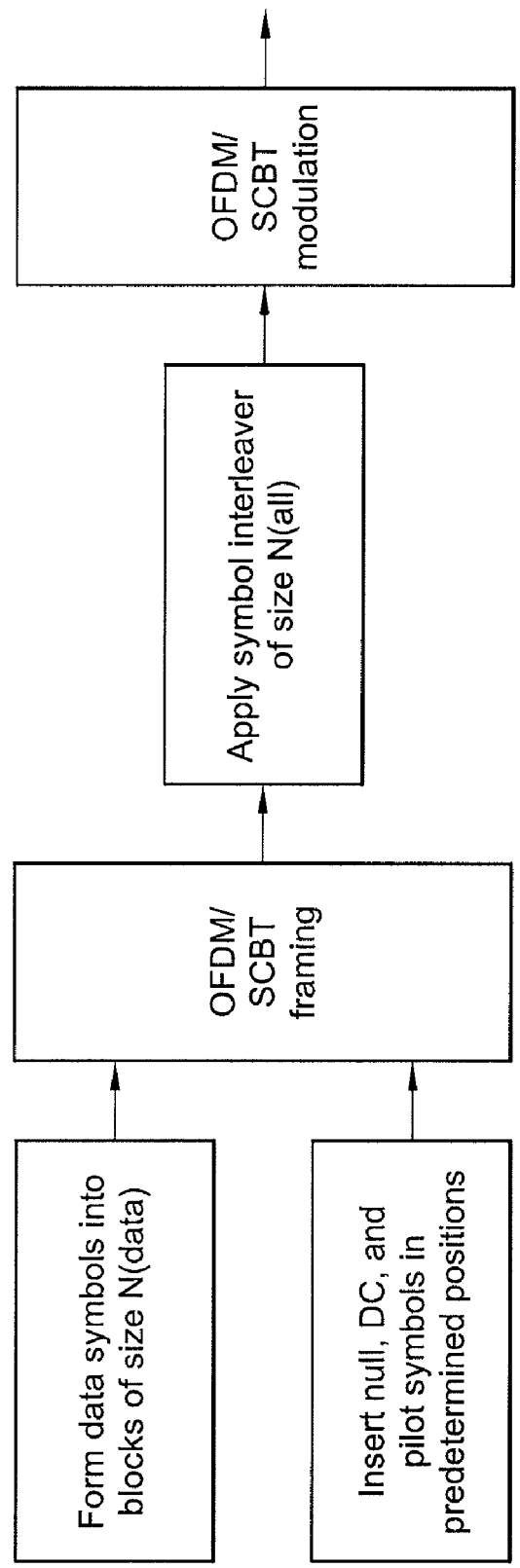
FIG. 7 is a functional block diagram of a system illustrating the use of a pseudorandom permuter to interleave data symbols as well as non-data symbols.

In another embodiment, the null, DC, and pilot symbols are inserted in pre-determined positions and a larger interleaver is formed that interleaves data symbols as well as the non-data symbols. Using the same example as above, an interleaver with a size of 512 may be formed, where the interleaved elements are data symbols as well as non-data (null, DC, pilot and others) symbols, as illustrated in FIG. 7.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of interleaving a sequence of communication symbols, the method comprising:
   receiving a first ordered sequence of communication symbols having a first order;
   permuting the first ordered sequence of communication symbols to generate a second ordered sequence of communication symbols having a second order; and
   outputting the second ordered sequence of communication symbols, wherein the second order is based, at least in part, on a third order having a greater size than the second order, the third order being a pseudorandom permutation sequence defined by the input-output relationship $$Y = \mod\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer, wherein the first ordered sequence, the second ordered sequence and the third ordered sequence each comprising a sequence of integers, wherein each integer corresponding to an ordinal position within its corresponding sequence, wherein the second order is represented by a sequence of consecutive integers from zero to N−1, wherein N is the size of the second order.

2. The method of claim 1, wherein the size of the third order is the smallest power of two greater than or equal to the size of the second order.

3. The method of claim 1, wherein the second order is based, at least in part on an abridgment of the third order.

4. The method of claim 3, wherein the second order is the third order with the $K^{th}$, $K+1^{st}$, $K+2^{nd}$, ..., $K+P−N−1^{st}$ element of the third order removed, wherein N is the size of the second order and K is an integer.

5. The method of claim 1, wherein the sequence of consecutive integers from zero to N−1 is derived from an abridgement and subsequent transformation of the pseudorandom permutation of a sequence of consecutive integers from zero to P−1 in increasing order, the abridgement comprising removal of the integers between K and K+P−N−1, wherein K is an integer, and the transformation comprising reduction of elements greater than K+P−N−1 by P−N.

6. The method of claim 1, wherein the first ordered sequence is received from a first error correcting code encoder.

7. The method of claim 1, wherein the second ordered sequence is output to a second error correcting code encoder.

8. The method of claim 1, wherein the first ordered sequence further comprises at least one of a null symbol, a DC component, or a pilot symbol.

9. The method of claim 1, wherein outputting the second ordered sequence of communication symbols comprising modulating the second ordered sequence of communication symbols onto a carrier signal and transmitting the modulated carrier signal.

10. The method of claim 1, wherein the communication symbols are representative of audio or video data.

11. The method of claim 10, wherein the communication symbols are representative of uncompressed high definition video data.

12. An interleaver comprising:
    a physical communication device comprising:
      an input configured to receive a first ordered sequence of communication symbols having a first order;
      a permuter configured to permute the first ordered sequence of communication symbols to generate a second ordered sequence of communication symbols having a second order; and
      an output configured to output the second ordered sequence of communication symbols,
    wherein the second order is based, at least in part, on a third order having a greater size than the second order, the third order being a pseudorandom permutation defined by the input-output relationship $$Y = \mod\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer, wherein the first ordered sequence, the second ordered sequence and the third ordered sequence each comprising a sequence of integers, wherein each integer corresponding to an ordinal position within its corresponding sequence, wherein the second order is represented by a sequence of consecutive integers from zero to N−1, wherein N is the size of the second order.

13. The interleaver of claim 12, wherein the sequence of consecutive integers from zero to N−1 is derived from an abridgement and subsequent transformation of the pseudo-random permutation of a sequence of consecutive integers from zero to P−1 in increasing order, the abridgement comprising removal of the integers between K and K+P−N−1, wherein K is an integer, and the transformation comprising reduction of elements greater than K+P−N−1 by P−N.

14. A method of de-interleaving a sequence of communication symbols, the method comprising:
receiving a second ordered sequence of communication symbols having a second order;
permuting the second ordered sequence of communication symbols to generate a first ordered sequence of communication symbols having a first order; and
outputting the first ordered sequence of communication symbols,
wherein the second order is based, at least in part, on a third order having a greater or equal size than the second order, the third order being a pseudorandom permutation defined by the input-output relationship $$Y = \mod\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer, wherein the first ordered sequence, the second ordered sequence and the third ordered sequence each comprising a sequence of integers, wherein each integer corresponding to an ordinal position within its corresponding sequence, wherein the second order is represented by a sequence of consecutive integers from zero to N−1, wherein N is the size of the second order.

15. The method of claim 14, wherein the sequence of consecutive integers from zero to N−1 is derived from an abridgement and subsequent transformation of the pseudo-random permutation of a sequence of consecutive integers from zero to P−1 in increasing order, the abridgement comprising removal of the integers between K and K+P−N−1, wherein K is an integer, and the transformation comprising reduction of elements greater than K+P−N−1 by P−N.

16. A de-interleaver comprising:
a physical communication device comprising:
an input configured to receive a second ordered sequence of communication symbols having a second order;
a permuter configured to permute the second ordered sequence of communication symbols to generate a first ordered sequence of communication symbols having a first order; and
an output configured to output the first ordered sequence of communication symbols,
wherein the second order is based, at least in part, on a third order having a greater or equal size than the second order, the third order being a pseudorandom permutation defined by the input-output relationship $$Y = \mod\left(\frac{m*S*(S+1)}{2}, P\right),$$

wherein P is the smallest power of two not less than the number of elements in the first ordered sequence, S is an input order represented by a sequence of consecutive integers from zero to P−1 in increasing order, Y is an output order represented as a sequence of integers, and m is an integer, wherein the first ordered sequence, the second ordered sequence and the third ordered sequence each comprising a sequence of integers, wherein each integer corresponding to an ordinal position within its corresponding sequence, wherein the second order is represented by a sequence of consecutive integers from zero to N−1, wherein N is the size of the second order.

17. The de-interleaver of claim 16, wherein the sequence of consecutive integers from zero to N−1 is derived from an abridgement and subsequent transformation of the pseudo-random permutation of a sequence of consecutive integers from zero to P−1 in increasing order, the abridgement comprising removal of the integers between K and K+P−N−1, wherein K is an integer, and the transformation comprising reduction of elements greater than K+P−N−1 by P−N.

\* \* \* \* \*